US009449995B2

(12) United States Patent
Im

(10) Patent No.: US 9,449,995 B2
(45) Date of Patent: Sep. 20, 2016

(54) ARRAY SUBSTRATE AND MANUFACTURING METHOD THEREOF, DISPLAY DEVICE

(71) Applicant: BOE TECHNOLOGY GROUP CO., LTD., Beijing (CN)

(72) Inventor: Jang Soon Im, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/416,358

(22) PCT Filed: May 13, 2014

(86) PCT No.: PCT/CN2014/077378
§ 371 (c)(1),
(2) Date: Jan. 22, 2015

(87) PCT Pub. No.: WO2015/096355
PCT Pub. Date: Jul. 2, 2015

(65) Prior Publication Data
US 2015/0325602 A1    Nov. 12, 2015

(30) Foreign Application Priority Data

Dec. 27, 2013    (CN) .......................... 2013 1 0741137

(51) Int. Cl.
*H01L 21/00*        (2006.01)
*H01L 27/12*        (2006.01)

(52) U.S. Cl.
CPC ......... *H01L 27/1251* (2013.01); *H01L 27/127* (2013.01); *H01L 27/1222* (2013.01); *H01L 27/1225* (2013.01); *H01L 27/1259* (2013.01)

(58) Field of Classification Search
CPC ........... H01L 27/1248; H01L 27/1251; H01L 29/78675; H01L 29/7869; H01L 27/3276; H01L 27/1225; H01L 27/127

USPC ..................................... 257/40, 43, 89, 98
See application file for complete search history.

(56) References Cited

U.S. PATENT DOCUMENTS 8,872,173 B2    10/2014  Yeh et al.
2009/0215212 A1    8/2009  Liu et al.
(Continued)

FOREIGN PATENT DOCUMENTS

CN    102629621 A    8/2012
CN    102646683 A    8/2012
(Continued)

OTHER PUBLICATIONS

Chinese First Office Action for Chinese Application CN 201310741137.8 issued on Sep. 28, 2014 in Chinese with the English translation.
(Continued)

*Primary Examiner* — Dung Le
(74) *Attorney, Agent, or Firm* — Collard & Roe, P.C.

(57) ABSTRACT

An array substrate and manufacturing method thereof and a display device are provided. The array substrate comprises a substrate (10) and a plurality of complementary thin film transistors provided on the substrate (10). The plurality of complementary thin film transistors comprise a first N-type thin film transistor (11) and a second P-type thin film transistor (12), and the first thin film transistor (11) is an oxide thin film transistor and the second thin film transistor (12) is a poly-silicon thin film transistor. The method of manufacturing the array substrate simplifies the manufacturing process and reduces production difficulty and cost.

20 Claims, 3 Drawing Sheets

(56) References Cited

U.S. PATENT DOCUMENTS

2010/0182223 A1* 7/2010 Choi .................... G09G 3/3233
 345/76
2012/0286279 A1* 11/2012 Hsu .................... H01L 27/1251
 257/66

FOREIGN PATENT DOCUMENTS

| CN | 103295962 A | 9/2013 |
|---|---|---|
| CN | 103474467 A | 12/2013 |
| CN | 103715196 A | 4/2014 |

OTHER PUBLICATIONS

Chinese Notification to Grant the Patent Right (Notice of Allowance) for Chinese Application CN 201310741137.8 issued on Feb. 11, 2015 in Chinese with the English translation.

International Search Report and Written Opinion of the International Searching Authority with Notice of Transmittal of the International Search Report and Written Opinon of PCT/CN2014/0477378 in Chinese, mailed Sep. 16, 2014.

English translation of the International Preliminary Report on Patentability and Written Opinion of the International Searching Authority of PCT/CN2014/077378, issued Jun. 28, 2016.

* cited by examiner

US 9,449,995 B2

ARRAY SUBSTRATE AND MANUFACTURING METHOD THEREOF, DISPLAY DEVICE

CROSS REFERENCE TO RELATED APPLICATIONS

This application is the National Stage of PCT/CN2014/077378 filed on May 13, 2014, which claims priority under 35 U.S.C. §119 of Chinese Application No. 201310741137.8 filed on Dec. 27, 2013, the disclosure of which is incorporated by reference.

TECHNICAL FIELD

Embodiments of the present invention relate to an array substrate and a manufacturing method thereof, and a display device.

BACKGROUND

In various of existing display devices, since an organic light-emitting diode (OLED) display has lighter and thinner appearance design, wider viewing angle and faster response speed and lower power consumption or the like compared with a cathode ray tube (CRT) display or a thin film transistor liquid crystal display (TFT-LCD), the OLED display has gradually become the next generation display device and has attracted considerable attention.

The OLED display device is a self-luminous device, which usually comprises a pixel electrode, a counter electrode opposite to the pixel electrode and an organic light-emitting layer between the pixel electrode and the counter electrode. The OLED display device applies a voltage to the pixel electrode and the counter electrode so as to form an electric field across the organic light-emitting layer between the pixel electrode and the counter electrode, thereby electrons and holes in the organic light-emitting layer can combine with each other for luminescence. An array substrate having circuit unit is used to control the voltage applied to the pixel electrode, thereby to control the display effect of the OLED display device.

SUMMARY

At least one embodiments of the present invention provide an array substrate, which comprises a substrate and a plurality of complementary thin film transistors provided on the substrate, wherein the plurality of complementary thin film transistors comprise a first thin film transistor of N-type and a second thin film transistor of P-type, and the first thin film transistor is an oxide thin film transistor and the second thin film transistor is a poly-silicon thin film transistor.

In an example, the first thin film transistor comprises a first gate electrode, a first source electrode and a first drain electrode; the second thin film transistor comprises a second gate electrode, a second source electrode and a second drain electrode; and the first gate electrode, the second source electrode and the second drain electrode are formed by one pattern process.

In an example, the second gate electrode, the first source electrode and the first drain electrode are formed by one pattern process.

In an example, a poly-silicon semiconductor active layer, a gate insulating layer, a second gate metal layer, an oxide semiconductor active layer, a dielectric layer and a first gate metal layer are in turn provided on the substrate; wherein the second gate metal layer comprises the second gate electrode, the first source electrode and the first drain electrode; the first gate metal layer comprises the first gate electrode, the second source electrode and the second drain electrode; wherein the first source electrode and the first drain electrode directly contact and are electrically connected with the oxide semiconductor active layer, the second source electrode and the second drain electrode are electrically connected with the poly-silicon semiconductor active layer through a via hole.

In an example, the array substrate further comprises a plurality of sub-pixel units, each of the sub-pixel units comprises a first thin film transistor and the second thin film transistor, and the first drain electrode is electrically connected with the second gate electrode by a connection electrode.

In an example, the array substrate further comprises a pixel electrode, and the pixel electrode electrically is connected with the second drain electrode.

At least one embodiments of the present invention provide a method of manufacturing an array substrate, the method comprises: forming a poly-silicon semiconductor active layer of a second thin film transistor on a substrate; forming a gate insulating layer on the substrate; forming a second gate electrode of the second thin film transistor and a first source electrode and a first drain electrode of a first thin film transistor on the substrate; forming an oxide semiconductor active layer of the first thin film transistor on the substrate, and forming a second source electrode and a second drain electrode of the second thin film transistor and a first gate electrode of the first thin film transistor on the substrate.

In an example, the second gate electrode of the second thin film transistor and the first source electrode and the first drain electrode of the first thin film transistor are formed on the substrate by one pattern process.

In an example, the second source electrode and the second drain electrode of the second thin film transistor and the first gate electrode of the first thin film transistor are formed on the substrate by one pattern process.

In an example, forming of the poly-silicon semiconductor active layer of the second thin film transistor on the substrate comprises: forming a poly-silicon layer on the substrate; and doping the poly-silicon layer.

In an example, after forming the second source electrode and the second drain electrode of the second thin film transistor and the first gate electrode of the first thin film transistor on the substrate, forming a connection electrode on the substrate, wherein the connection electrode is connected with the first drain electrode and the second gate electrode, respectively.

In an example, the method further comprises: forming a pixel electrode on the substrate, wherein the pixel electrode is electrically connected with the second drain electrode.

At least one embodiments of the present invention provides a display device, which comprises any of the array substrates according to any of the embodiments of the present invention.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

DETAILED DESCRIPTION

Figure 1:
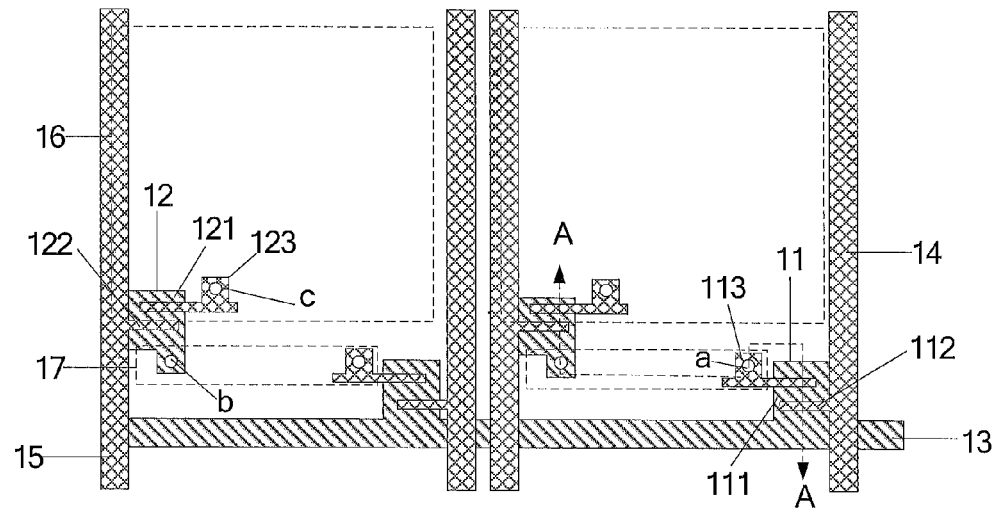
FIG. 1 is a top view of partial substructure of an array substrate.

Technical solutions according to the embodiments of the present invention will be described clearly and completely as below in conjunction with the accompanying drawings of embodiments of the present invention. It is apparent that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

In an OLED display device, complementary thin film transistors (CMOS) are often used in the drive circuit. The CMOS manufacturing process mainly forms patterns required by thin film transistors or the like in various thin film layers by pattern processes, which requires multiple pattern processes. For example, the manufacturing process usually requires eleven mask lithography processes and three doping processes, and each pattern process costs expensively. Therefore, the inventor notices that the times of pattern processes and complex manufacturing steps restrict the manufacture of the OLED display devices with drive circuits made based on CMOS; and in order to meet the development requirement of OLED display device being lighter and thinner, how to reasonably reduce its thickness is also a problem to be solved.

It should be noted that the "pattern process" refers to a process of forming a thin film to a layer comprising at least one pattern. The pattern process usually comprises: coating photoresist on the thin film; exposing the photoresist by using a mask, etching away the photoresist required to be removed by using a developer, etching away the thin film that is not coated with the photoresist, and removing the remained photoresist. In embodiments of the present invention, "one pattern process" refers to a process of forming the required layer by one exposure.

At least one embodiments of the present invention provide an array substrate, which comprises a plurality of complementary thin film transistors (TFTs). The plurality of complementary TFTs comprise a first thin film transistor (TFT) of N-type and a second thin film transistor of P-type. The first thin film transistor is an oxide thin film transistor and the second thin film transistor is a poly-silicon thin film transistor.

It should be noted that the array substrate is divided into a plurality of sub-pixel units by gate lines intersecting with data lines. The active layer of the oxide thin film transistor (also referred to as the thin film transistor) is an oxide semiconductor layer. The active layer of the poly-silicon thin film transistor (also referred to as the thin film transistor) is a poly-silicon semiconductor layer. The oxide forming the semiconductor oxide layer may comprise indium gallium zinc oxide (IGZO), Mg—In—Zn—O (MIZO) or the like.

Figure 2:
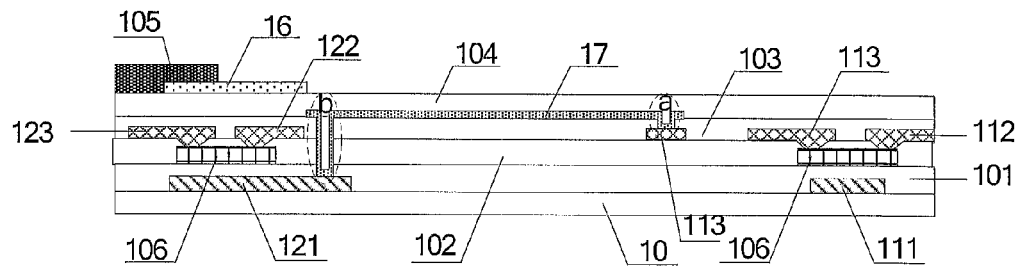
FIG. 2 is a cross-section view of FIG. 1 along A-A.

FIG. 1 shows an array substrate. For example, for a case of two transistors of the CMOS being disposed in the same pixel unit of the OLED display device, each sub-pixel unit comprises a switch thin film transistor 11 (a first thin film transistor) and a drive thin film transistor 12 (a second thin film transistor). A gate line 13 is connected with a gate electrode (a first gate electrode) 111 of the switch thin film transistor 11, a data line 14 is connected with a source electrode (a first source electrode) 112 of the switch thin film transistor 11, a first drain electrode 113 of the switch thin film transistor 11 is connected to a gate electrode (a second gate electrode) 121 of the drive thin film transistor 12 through a via hole a. A Vdd line 15 parallel to the data line 14 is connected to a source electrode (a second source electrode) 122 of the drive thin film transistor 12, and a second drain electrode 123 of the drive thin film transistor 12 is connected with a pixel electrode 16. FIG. 2 is a cross-section view of FIG. 1 along A-A. As seen from FIG. 2, two TFTs are formed on a substrate 10, and both use bottom gate structure. A gate insulating layer 101, a poly-silicon active layer 106, a dielectric layer 102, a passivation layer 103, a planarization layer 104 and a pixel defining layer 105 are formed in turn on the first gate electrode 111 and the second gate electrode 121. The first drain electrode 113 is connected with a connection electrode 17 through a via hole a, and the second gate electrode 121 is connected with the connection electrode 17 through a via hole b. As such, the connection electrode 17 can connect the first drain electrode 113 with the second gate electrode 121.

In general technology, the first thin film transistor and the second thin film transistor are poly-silicon thin film transistors. The second thin film transistor is a PMOS transistor, the first thin film transistor is a NMOS transistor, and a P+ doping is required when an active layer of the PMOS transistor is formed on the array substrate, N+ doping and LDD doping are required when a source electrode and a drain electrode of the NMOS transistor are formed, and a source-drain region corresponding to the source and the drain electrode of the active layer is formed by doping. However, the doping process is complicated, which requires exposure, and the apparatus is expensive.

Furthermore, for a poly-silicon thin film transistor, it usually needs ion implantation, and at least two times of being crystallized. The embodiments of the present invention only need once crystallization, which reduces the times of crystallization, save time and reduce production cost. In the embodiments of the present invention, the first thin film transistor of the complementary thin film transistor (CMOS) on the array substrate is an oxide thin film transistor, and the second thin film transistor of the complementary thin film transistor on the array substrate is a poly-silicon thin film transistor. Since the second thin film transistor only needs to be doped one time, and the oxide thin film transistor can be directly formed by deposition without doping and crystallization, it reduces at least two doping processes and one crystallization process with respect to general technology. It simplifies manufacturing process and reduces production difficulty and production cost.

Furthermore, as shown in FIG. 1, the array substrate further comprises a positive power input Vdd line 15. In a practical application, the second source electrodes of the second thin film transistors of sub-pixel units in the same line each can be connected with the Vdd line, and a source signal is provided to the second source electrode through the Vdd line. Since FIG. 3 is a partial cross-section view of FIG. 1, the Vdd line is not shown in FIG. 3.

Figure 3:
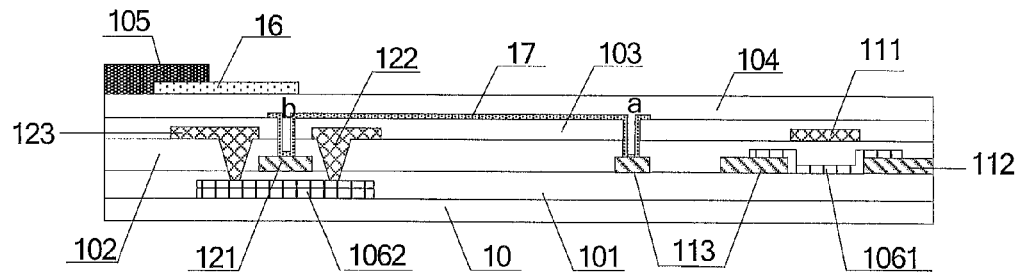
FIG. 3 is a cross-section view of an array substrate according to an embodiment of the present invention.

Alternatively, as shown in FIG. 3, the first thin film transistor comprise the first gate electrode 111, the first source electrode 112 and the first drain electrode 113. The second thin film transistor comprises the second gate electrode 121, the second source electrode 122 and the second drain electrode 123. The first gate electrode 111, the second source electrode 122 and the second drain electrode 123 are formed by one pattern process. That is, the first gate electrode of the first thin film transistor and the second source electrode and the second drain electrode of the second thin film transistor are formed by one pattern process.

Alternatively, as shown in FIG. 3, the second gate electrode 121, the first source electrode 111 and the first drain electrode 112 are formed by one pattern process. That is, the first source electrode and the first drain electrode of the first thin film transistor and the second gate electrode of the second thin film transistor are formed by one pattern process.

Alternatively, the array substrate comprises a substrate and a poly-silicon semiconductor active layer, a gate insulating layer, a second gate metal layer, an oxide semiconductor active layer, a dielectric layer and a first gate metal layer in turn provided on the substrate. The second gate metal layer comprises a second gate electrode, a first source electrode and a first drain electrode. The first gate metal layer comprises a first gate electrode, a second source electrode and a second drain electrode. The first source electrode and the first drain electrode directly contact and is electrically connected with the oxide semiconductor active layer. The second source electrode and the second drain electrode are electrically connected with the poly-silicon semiconductor active layer through a via hole.

Figure 4:
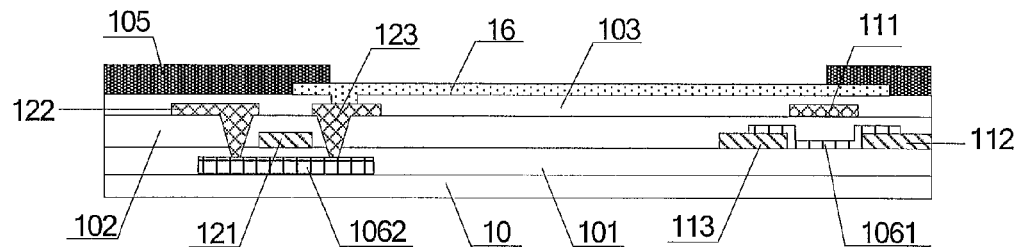
FIG. 4 is a cross-section view of another array substrate according to an embodiment of the present invention.

For example, as shown in FIG. 4, the array substrate comprises a substrate 10 and a poly-silicon semiconductor active layer, a gate insulating layer, a second gate metal layer, an oxide semiconductor active layer, a dielectric layer and a first gate metal layer in turn provided on the substrate 10. The poly-silicon semiconductor active layer comprises a second active layer 1062. The second gate metal layer comprises a second gate electrode 121, a first source electrode 112 and a first drain electrode 113. The oxide semiconductor active layer comprises a first active layer 1061. The first gate metal layer comprises a first gate electrode 111, a second source electrode 122 and a second drain electrode 123. The first source electrode 112 and the first drain electrode 123 directly contact and is electrically connected with the oxide semiconductor active layer (the first active layer) 1061. The second source electrode 122 and the second drain electrode 123 are electrically connected with the poly-silicon semiconductor active layer (the second active layer) 1062 through a via hole. For example, a source-drain region corresponding to the second source electrode and the second drain electrode of the second active layer is formed by doping. The source electrode and the drain electrode are connected with the source-drain region of the active layer, respectively.

Alternatively, as shown in FIGS. 1 and 3, the array substrate further comprises a plurality of sub-pixel units, each sub-pixel unit comprises a first thin film transistor 11 and a second thin film transistor 12, and the first drain electrode 113 is electrically connected with the second gate electrode 121 through a connection electrode 17. Each of the sub-pixel units comprises a first thin film transistor 11 and a second thin film transistor 12, wherein the first thin film transistor is a switch thin film transistor, and the second thin film transistor is a drive thin film transistor. Certainly, the function of the first thin film transistor and the second thin film transistor can vary based on the different structure of the substrate. The embodiments of the present invention are only described as examples as illustrated in the drawings.

Alternatively, the array substrate further comprises a pixel electrode, and the pixel electrode is electrically connected with the second drain electrode. For example, as shown in FIG. 3, the array substrate further comprises a pixel electrode 16, and as shown in FIG. 1, the pixel electrode 16 is electrically connected with the second drain electrode 123 through a via hole c, and the second drain electrode 123 controls the current signals provided to the pixel electrode 16; or as shown in FIG. 4, the array substrate further comprises a pixel electrode 16, and the pixel electrode 16 is electrically connected with the second drain electrode 123 through a via hole, and the second drain electrode 123 controls the current signals provided to the pixel electrode 16.

It should be noted that the structure as show in FIG. 3 is illustrated by disposing NMOS transistor and PMOS transistor in a same pixel unit of the OLED display device as an example. However, the array substrates provided by the embodiments of the present invention are not limited to those shown in FIGS. 3 and 4. Based on the structure of the current array substrate, the array substrates may be formed with other thin film or layer structures.

Additionally, the locations of the first thin film transistor and the second thin film transistor in FIGS. 3 and 4 according to the embodiments of the present invention are only an exemplary. For different embodiments, the locations of the first thin film transistor and the second thin film transistor can be varied. For example, in the example shown in FIG. 4, the first thin film transistor may need not to be disposed under the pixel electrode 16.

Embodiments of the present invention further provide a method of manufacturing an array substrate, the method comprises: S101, a poly-silicon semiconductor active layer of a second thin film transistor is formed on a substrate.

Figure 5:
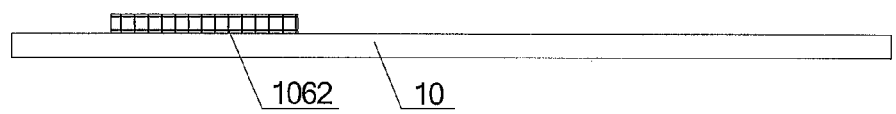
FIG. 5 is a schematic structural view of the substrate with poly-silicon semiconductor active layer.

For example, as shown in FIG. 5, a poly-silicon semiconductor active layer (a second active layer) 1062 is formed on a substrate 10. For example, as shown in FIG. 11, the above step 101 comprises the following steps.

Step 1011, a poly-silicon semiconductor active layer is formed on a substrate, wherein forming of the poly-silicon semiconductor active layer is implemented by forming a monocrystalline silicon layer and crystallizing the monocrystalline silicon layer, for example.

Step 1012, the poly-silicon semiconductor active layer is doped, wherein doping of the poly-silicon semiconductor active layer is implemented by performing ion implantation. The two ends of the poly-silicon semiconductor active layer are doped, thereby a source-drain region corresponding to a source electrode and a drain electrode is formed on the poly-silicon semiconductor active layer.

Step 102, a gate insulating layer is formed on the substrate.

Step 103, a second gate electrode of the second thin film transistor and a first source electrode and a first drain electrode of the first thin film transistor are formed on the substrate.

Figure 6:
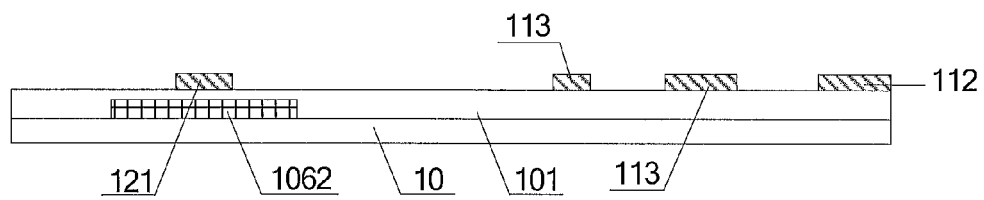
FIG. 6 is a schematic structural view of the substrate with a first source electrode, a first drain electrode and a second gate electrode.

For example, as shown in FIG. 6, a second gate electrode 121 of the second thin film transistor and a first source electrode 112 and a first drain electrode 113 of the first thin film transistor are formed on the substrate by one pattern process (that is one exposure). It should be noted that a data line and a Vdd line are formed on the substrate while the first source electrode and the first drain electrode are formed on the substrate, and the data line is connected with the first source electrode so as to provide a source signal to the first source electrode; and the Vdd line is connected with the second source electrode so as to provide a source signal to the second source electrode.

Step 104, an oxide semiconductor active layer of the first thin film transistor is formed on the substrate.

Figure 7:
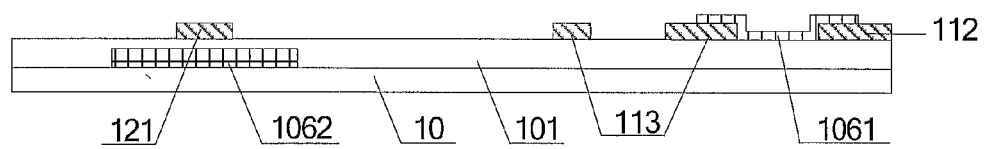
FIG. 7 is a schematic structural view of the substrate with an oxide semiconductor active layer.

For example, as shown in FIG. 7, an oxide semiconductor active layer (a first active layer) 1061 is formed on the position of the substrate corresponding to the first source electrode 112 and the first drain electrode 113. The material of making the oxide semiconductor active layer can comprise IGZO and MIZO or the like.

S105: a second source electrode and a second drain electrode of the second thin film transistor and a first gate electrode of the first thin film transistor are formed on the substrate.

Figure 8:
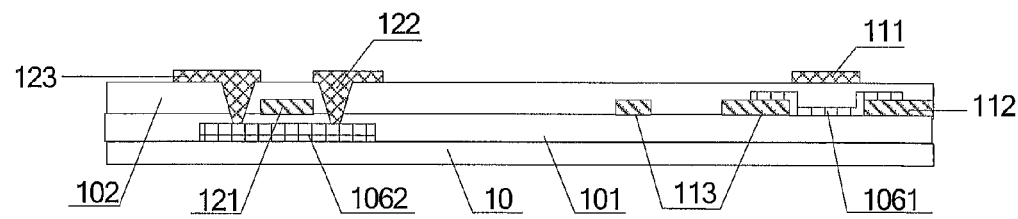
FIG. 8 is a schematic structural view of the substrate with a second source electrode, a second drain electrode and a first gate electrode.

For example, before the above step S105, the method further comprises forming a dielectric layer 102 on the substrate, as shown in FIG. 8. As shown in FIG. 8, a second source electrode 122 and a second drain electrode 123 of the second thin film transistor 12 and a first gate electrode 111 of the first thin film transistor are formed on the substrate 10 by one pattern process. It should be noted that the second source electrode 122 is electrically connected with the Vdd line through a via hole (not shown).

Alternatively, after the second source electrode 122 and the second drain electrode 123 of the second thin film transistor 12 and the first gate electrode 111 of the first thin film transistor 11 are formed on the substrate 10, the method further comprises forming a connection electrode 17 on the substrate 10, wherein the connection electrode 17 is connected with the first drain electrode 113 and the second gate electrode 121, respectively.

Figure 9:
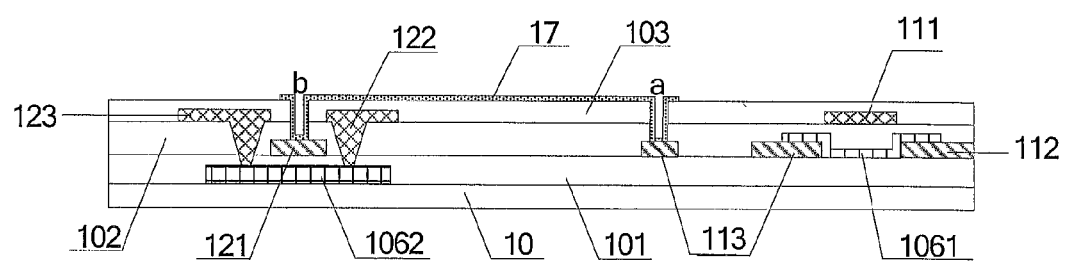
FIG. 9 is a schematic structural view of the substrate with a connection electrode.

As shown in FIG. 9, the connection electrode 17 is respectively connected with the first drain electrode 113 and the second gate electrode 121 through via holes a and b so that the first drain electrode 113 is electrically connected with the second gate electrode 121.

Alternatively, the method further comprises forming a pixel electrode on the substrate, wherein the pixel electrode is electrically connected with the second drain electrode.

As shown in FIG. 3, the array substrate further comprises a pixel electrode 16. As shown in FIG. 1, the pixel electrode 16 is electrically connected with the second drain electrode 123 through a via hole, and the second drain electrode 123 controls current signals provided to the pixel electrode 16; or as shown in FIG. 4, the array substrate further comprises a pixel electrode 16, and the pixel electrode is electrically connected with the second drain electrode 123 through a via hole, and the second drain electrode 123 controls current signals provided to the pixel electrode 16.

It should be noted that the array substrates provided by the embodiments of the present invention are not limited to those shown in FIGS. 3 and 4. Based on the structure of an array substrate, the array substrates may be formed with other thin film or layer structures.

It should be noted that the method for manufacturing the array substrate provided by the embodiments of the present invention are not limited to the above methods. For example, the thin film transistors are divided into two types based on the relationship between the gate electrode and the source electrode and the drain electrode of the thin film transistor. One type is that the gate electrode is disposed under the source electrode and the drain electrode, which is referred to as a bottom gate type thin film transistor; another type is that the gate electrode is disposed above the source electrode and the drain electrode, which is referred to as top gate type thin film transistor. In the array substrate provided by the embodiments of the present invention, as an example, the first thin film transistor is a top gate type thin film transistor, and the second thin film transistor is bottom gate type thin film transistor. However, in the array substrate, the first thin film transistor can be a bottom gate type thin film transistor, and the second thin film transistor can be a top gate type thin film transistor. If such an arrangement is used, the above manufacturing order should be adjusted accordingly, but the manufacturing method is similar to the above method.

In a method for manufacturing the array substrate known by the inventor, two times of crystallizations are performed to form the poly-silicon thin film transistor and thirteen mask exposures are performed to respectively form a gate layer, a gate insulating layer, an active layer, P+doping, N+doping, LDD doping, a dielectric layer, a source-drain electrode layer, a passivation layer, a connection electrode layer, a planarization layer, a pixel electrode and a pixel defining layer. The method of manufacturing the array substrate provided by embodiments of the present invention performs one crystallization and twelve mask exposures to respectively form a poly-silicon semiconductor active layer, P+doping, a gate insulating layer, a second gate metal layer (comprising a first source electrode, a first drain electrode and a second gate electrode), an oxide semiconductor active layer, a dielectric layer, a first gate electrode metal layer (comprising a second source electrode, a second drain electrode and a first gate electrode), a passivation layer, a connection electrode layer, a planarization layer, a pixel electrode and a pixel defining layer, thereby to form the array substrate as shown in FIG. 3; or the method performs one crystallization and nine mask exposures to respectively form a poly-silicon semiconductor active layer, P+doping, a gate insulating layer, a second gate metal layer (comprising a first source electrode, a first drain electrode and a second gate electrode), an oxide semiconductor active layer, a dielectric layer, a first gate metal layer (comprising a second source electrode, a second drain electrode and a first gate electrode), a passivation layer, a planarization layer, a pixel electrode and a pixel defining layer, thereby to form the array substrate as shown in FIG. 4.

The method of manufacturing the array substrate according to embodiments of the present invention forms a first oxide thin film transistor and a second poly-silicon thin film transistor on the substrate, which reduces at least two doping processes and one crystallization process with respect to the method for manufacturing the first thin film transistor and the second thin film transistor both as a poly-silicon thin film transistor, therefore, it simplifies manufacturing process and reduces production difficulty and production post.

The embodiment of the present invention provide a display device, which comprises any of the array substrates provided by embodiments of the present invention. The display device can be a crystal liquid display device, an OLED display device and any products or components including such display devices with display function, such as a television, digital camera, computer or the like.

It is understood that the above embodiments and implementations are only for explaining the present invention, and the present invention is not intended to limited thereto. For one of ordinary skill in the art, various modifications and variations may be made without departing from the spirit and scope of embodiments of the present invention, and all of which shall fall within the protection scope of the present invention. The scope protected by the present invention is defined by the claims.

The present invention claims priority of Chinese patent application No. 201310741137.8 filed on Dec. 27, 2013 titled "array substrate and manufacturing method thereof, display device", the contents of which are incorporated herein by reference.

What is claimed is:

1. An array substrate, comprising:
   a plurality of complementary thin film transistors, wherein the plurality of complementary thin film transistors comprise a first thin film transistor of N-type and a second thin film transistor of P-type, and the first thin film transistor is an oxide thin film transistor and the second thin film transistor is a poly-silicon thin film transistor;
   wherein the first thin film transistor comprises a first gate electrode, a first source electrode and a first drain electrode; the second thin film transistor comprises a second gate electrode, a second source electrode and a second drain electrode; and the first gate electrode, the second source electrode and the second drain electrode are provided in a same layer.

2. The array substrate according to claim 1, wherein the second gate electrode, the first source electrode and the first drain electrode are provided in a same layer.

3. The array substrate according to claim 2, further comprising a substrate and a poly-silicon semiconductor active layer, a gate insulating layer, a second gate metal layer, an oxide semiconductor active layer, a dielectric layer and a first gate metal layer provided in turn on the substrate; wherein
   the second gate metal layer comprises the second gate electrode, the first source electrode and the first drain electrode;
   the first gate metal layer comprises the first gate electrode, the second source electrode and the second drain electrode; and
   the first source electrode and the first drain electrode directly contact and are electrically connected with the oxide semiconductor active layer, the second source electrode and the second drain electrode are electrically connected with the poly-silicon semiconductor active layer through a via hole.

4. The array substrate according to claim 1, further comprising a plurality of sub-pixel units, wherein each of the sub-pixel units comprises the first thin film transistor and the second thin film transistor, and the first drain electrode is electrically connected with the second gate electrode by a connection electrode.

5. The array substrate according to claim 1, further comprising a pixel electrode, wherein the pixel electrode is electrically connected with the second drain electrode.

6. A method of manufacturing an array substrate, comprising:
   forming a poly-silicon semiconductor active layer of a second thin film transistor on a substrate;
   forming a gate insulating layer on the substrate;
   forming a second gate electrode of the second thin film transistor and a first source electrode and a first drain electrode of a first thin film transistor on the substrate by one pattern process;
   forming an oxide semiconductor active layer of the first thin film transistor on the substrate, and
   forming a second source electrode and a second drain electrode of the second thin film transistor and a first gate electrode of the first thin film transistor on the substrate.

7. The method of manufacturing the array substrate according to claim 6, wherein the second source electrode and the second drain electrode of the second thin film transistor and the first gate electrode of the first thin film transistor are formed on the substrate by one pattern process.

8. The method of manufacturing the array substrate according to claim 6, wherein forming of the poly-silicon semiconductor active layer of the second thin film transistor on the substrate comprises:
   forming a poly-silicon layer on the substrate; and
   doping the poly-silicon layer.

9. The method of manufacturing the array substrate according to claim 6, further comprising:
   after forming the second source electrode and the second drain electrode of the second thin film transistor and the first gate electrode of the first thin film transistor on the substrate, forming a connection electrode on the substrate, wherein the connection electrode is connected with the first drain electrode and the second gate electrode, respectively.

10. The method of manufacturing the array substrate according to claim 6, further comprising:
    forming a pixel electrode on the substrate, wherein the pixel electrode is electrically connected with the second drain electrode.

11. A display device, comprising the array substrate according to claim 1.

12. The array substrate according to claim 2, further comprising a plurality of sub-pixel units, wherein each of the sub pixel units comprises the first thin film transistor and the second thin film transistor, and the first drain electrode is electrically connected with the second gate electrode by a connection electrode.

13. The array substrate according to claim 3, further comprising a plurality of sub-pixel units, wherein each of the sub pixel units comprises the first thin film transistor and the second thin film transistor, and the first drain electrode is electrically connected with the second gate electrode by a connection electrode.

14. The array substrate according to claim 2, further comprising a pixel electrode, wherein the pixel electrode is electrically connected with the second drain electrode.

15. The array substrate according to claim 3, further comprising a pixel electrode, wherein the pixel electrode is electrically connected with the second drain electrode.

16. The array substrate according to claim 4, further comprising a pixel electrode, wherein the pixel electrode is electrically connected with the second drain electrode.

17. An array substrate, comprising:
  a plurality of complementary thin film transistors, wherein the plurality of complementary thin film transistors comprise a first thin film transistor of N-type and a second thin film transistor of P-type, and the first thin film transistor is an oxide thin film transistor and the second thin film transistor is a poly-silicon thin film transistor;
  wherein the first thin film transistor comprises a first gate electrode, a first source electrode and a first drain electrode; the second thin film transistor comprises a second gate electrode, a second source electrode and a second drain electrode; and the second gate electrode, the first source electrode and the first drain electrode are provided in a same layer.

18. The array substrate according to claim 17, further comprising a substrate and a poly-silicon semiconductor active layer, a gate insulating layer, a second gate metal layer, an oxide semiconductor active layer, a dielectric layer and a first gate metal layer provided in turn on the substrate; wherein the second gate metal layer comprises the second gate electrode, the first source electrode and the first drain electrode;
  the first gate metal layer comprises the first gate electrode, the second source electrode and the second drain electrode; and
  the first source electrode and the first drain electrode directly contact and are electrically connected with the oxide semiconductor active layer, the second source electrode and the second drain electrode are electrically connected with the poly-silicon semiconductor active layer through a via hole.

19. The array substrate according to claim 17, further comprising a plurality of sub-pixel units, wherein each of the sub-pixel units comprises the first thin film transistor and the second thin film transistor, and the first drain electrode is electrically connected with the second gate electrode by a connection electrode.

20. The array substrate according to claim 17, further comprising a pixel electrode, wherein the pixel electrode is electrically connected with the second drain electrode.

* * * * *